United States Patent [19]

Naghshineh

[11] Patent Number: 5,124,579
[45] Date of Patent: Jun. 23, 1992

[54] CMOS OUTPUT BUFFER CIRCUIT WITH IMPROVED GROUND BOUNCE

[76] Inventor: Kianoosh Naghshineh, 165 E. Okeefe St., #28, Menlo Park, Calif. 94025

[21] Appl. No.: 636,530

[22] Filed: Dec. 31, 1990

[51] Int. Cl.⁵ .................. H03K 17/16; H03K 17/687; H03K 17/284
[52] U.S. Cl. .................. 307/443; 307/247.1; 307/572; 307/596
[58] Field of Search ............ 307/443, 475, 481, 247.1, 307/571, 572, 542, 547, 548, 263, 596

[56] References Cited

U.S. PATENT DOCUMENTS 4,961,010 10/1990 Davis .............................. 307/542 X
5,034,637 7/1991 Jungert ............................ 307/443 X Primary Examiner—David Mis

[57] ABSTRACT

A CMOS output buffer circuit for providing an output signal at an output terminal with a significant reduction in ground bounce includes a pull-up driver circuit (12), a pull-down driver circuit (14), and a control circuit (16). The pull-up driver circuit includes first and second resistive means for delaying the turn-on times of pull-up transistors. The pull-down driver circuit includes third and fourth resistive elements for delaying the turn-on times of pull-down transistors. Each of the first through fourth resistive elements (D1–D4) is formed of a transmission gate and serves to control the gate-to-source voltages applied to the respective gates of the pull-up and pull-down transistors.

14 Claims, 3 Drawing Sheets

CMOS OUTPUT BUFFER CIRCUIT WITH IMPROVED GROUND BOUNCE

BACKGROUND OF THE INVENTION

This invention relates generally to semiconductor integrated circuits and more particularly, it relates to a CMOS output buffer circuit which has a significant reduction in ground bounce.

As is well-known in the art, digital logic circuits are widely used in the areas of electronics and computer-type equipment. Specifically, one such use of digital logic circuits is to provide an interface function between one logic type (i.e., TTL) of a first integrated circuit device and another logic type (i.e., CMOS) of a second integrated circuit device. An output buffer circuit is an important component for this interface function. The output buffer circuit provides, when enabled, an output signal which is a function of a data input signal received from other logic circuitry of the integrated circuit.

Output buffer circuits typically use a pull-up transistor device and a pull-down transistor device connected in series between first and second external power supply terminal pins. The first power supply terminal pin may be supplied with a positive potential or voltage VCC, which is connected to an internal power supply potential node via a first connection lead having associated package inductance. The second power supply terminal pin may be supplied with a ground potential VSS which is connected to an internal ground potential node via a second connection lead having associated package inductance. The common connection point of the pull-up and pull-down transistor devices defines an internal output node which is further joined to an external output terminal pin via a third connection lead having associated package inductance. The external output terminal pin is used for driving other circuitry on other integrated circuits which may have widely varying capacitive loading effects.

Dependent upon the logic state of the data input signal and an enable signal being in the active state, either the pull-up or pull-down transistor device is quickly turned OFF and the other one of them is turned ON. Such rapid switching OFF and ON of the pull-up and pull-down devices causes sudden surges of current creating what is commonly known as current spikes. As a result, when the internal output node is making a high-to-low transition, oscillation or inductive ringing will appear at the output terminal pin referred to as "ground bounce." This "ground bounce" is defined to be the undershooting of the ground potential followed by a dampening oscillation around it. This is a major problem encountered in designing high speed, output buffer circuits.

Also, during such output switching, charging and discharging currents from the pull-up and pull-down transistor devices will flow through the package inductances of the power supply and ground lines so as to cause inductive noises at the internal power supply potential node and at the internal ground potential node. While it is desired to have large pull-up and pull-down devices for charging or discharging the capacitive loads at high speeds, which is advantageous, this will also cause increased noises on the internal supply and ground lines that are undesirable since they will degrade the output levels (logic "1" and logic "φ") causing interface problems among the output buffer circuit and other integrated circuits. Further, in VLSI systems there will be many output buffer circuits which are switching simultaneously. Thus, it is desired that each output buffer circuit cause a minimal amount of noise on the internal supply and ground lines. However, this should be achieved without sacrificing the high speed of operation. In addition, this should be maintained independently of variations in process parameters.

There have been attempts made in the prior art of output buffer design to minimize the ground bounce and the supply and ground noises without sacrificing the needed high-speed of operation. In FIG. 1, there is shown a schematic circuit diagram of a prior art output buffer circuit which includes a staged pull-up means formed of a first plurality of N-channel transistors 2a, 2b and 2c and a staged pull-down means formed of a second plurality of N-channel transistors 3a, 3b and 3c. The input signal is fed to two AND logic gates 4a, 4b whose outputs provide control signals via inverters for driving the pull-up and pull-down means, respectively. Since there is no effective control of the gate-to-source voltage $V_{GS}$, there exists the possibility that one of the transistors in either the pull-up or pull-down means will still be turned on when one of the transistors in the pull-down or pull-up means is being turned on, resulting in a cross-over current due to their simultaneous conduction.

In FIG. 2, there is shown a schematic circuit diagram of another of the prior art output buffer circuit which also includes a staged pull-up means formed of two N-channel transistors 5a, 5b connected in parallel and a staged pull-down means formed of two N-channel transistors 6a, 6b connected in parallel. There are provided NAND logic gates 7l-7d and NOR logic gates 8a, 8b which are used to turn off and on the transistors in the pull-up and pull-down means in a correct sequence. However, since there is likewise no control of the voltage $V_{GS}$, this prior art circuit does not always perform the proper switching sequence of the transistors as it was designed to do.

The present invention controls the gate-to-source voltages applied to the gates of the transistors to be turned on in the pull-up or pull-down driver circuit after all of the transistors in the pull-down or pull-up driver circuit have been turned off. This is achieved by the provision of resistive means connected in series to the gates of certain ones of the transistors in the pull-up and pull-down driver circuit for delaying the turning on of the same.

SUMMARY OF THE INVENTION

Accordingly, it is a general object of the present invention to provide a CMOS output buffer circuit with a significant reduction in ground bounce which is relatively simple and economical to manufacture and assemble, but yet overcomes the disadvantages of the prior art buffer circuits.

It is an object of the present invention to provide an improved CMOS output buffer circuit which has a significant reduction in inductive ringing.

It is another object of the present invention to provide a CMOS output buffer circuit which includes resistive means connected in series with the gates of certain ones of the transistors in the pull-up driver circuit and pull-down driver circuit so as to form RC delay circuits for limiting the rate of rise of the gate-to-source voltages.

It is still another object of the present invention to provide a CMOS output buffer circuit which is formed of a pull-up driver circuit, a pull-down driver circuit, and a control circuit for limiting the rate of rise of the gate-to-source voltages, thereby reducing significantly the ground bounce.

In accordance with these aims and objectives, the present invention is concerned with the provision of a CMOS output buffer circuit for providing an output signal at an output terminal with a significant reduction in ground bounce. The CMOS output buffer circuit includes a pull-up driver circuit, a pull-down driver circuit, and a control circuit. The pull-up driver circuit is responsive to a first control signal for generating a transition from a low logic level to a high logic level at the output terminal. The pull-up driver circuit includes at least first and second pull-up transistors. Each of the first and second pull-up transistors has one of its main electrodes connected to a power supply potential and its other one of its main electrodes coupled to the output terminal. The gate of the first pull-up transistor is coupled to receive the first control signal. The gate of the second pull-up transistor is coupled to receive the first control signal via a first resistive means. The first resistive means and the gate capacitance of the second pull-up transistor forms a first RC circuit for delaying the turn-on time of the second pull-up transistor relative to the first pull-up transistor during the low-to-high transition at the output terminal.

The pull-down driver circuit is responsive to a second control signal for generating a transition from the high logic level to the low logic level at the output terminal. The pull-down driver circuit includes at least first and second pull-down transistors. Each of the first and second pull-down transistors has one of its main electrodes connected to the output terminal and its other one of its main electrodes coupled to a ground potential. The gate of the first pull-down transistor is coupled to receive the second control signal. The gate of the second pull-down transistor is coupled to receive the second control signal via second resistive means. The second resistive means and the gate capacitance of the second pull-down transistor forms a second RC circuit for delaying the turn-on time of the second pull-down transistor relative to the first pull-down transistor during the high-to-low transition at the output terminal. The control circuit is responsive to a data input signal and is formed of first and second NAND logic gates connected to form a cross-coupled latch. The first control signal is provided at the output of the first NAND logic gate and the second control signal is provided at the output of the second NAND logic gate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
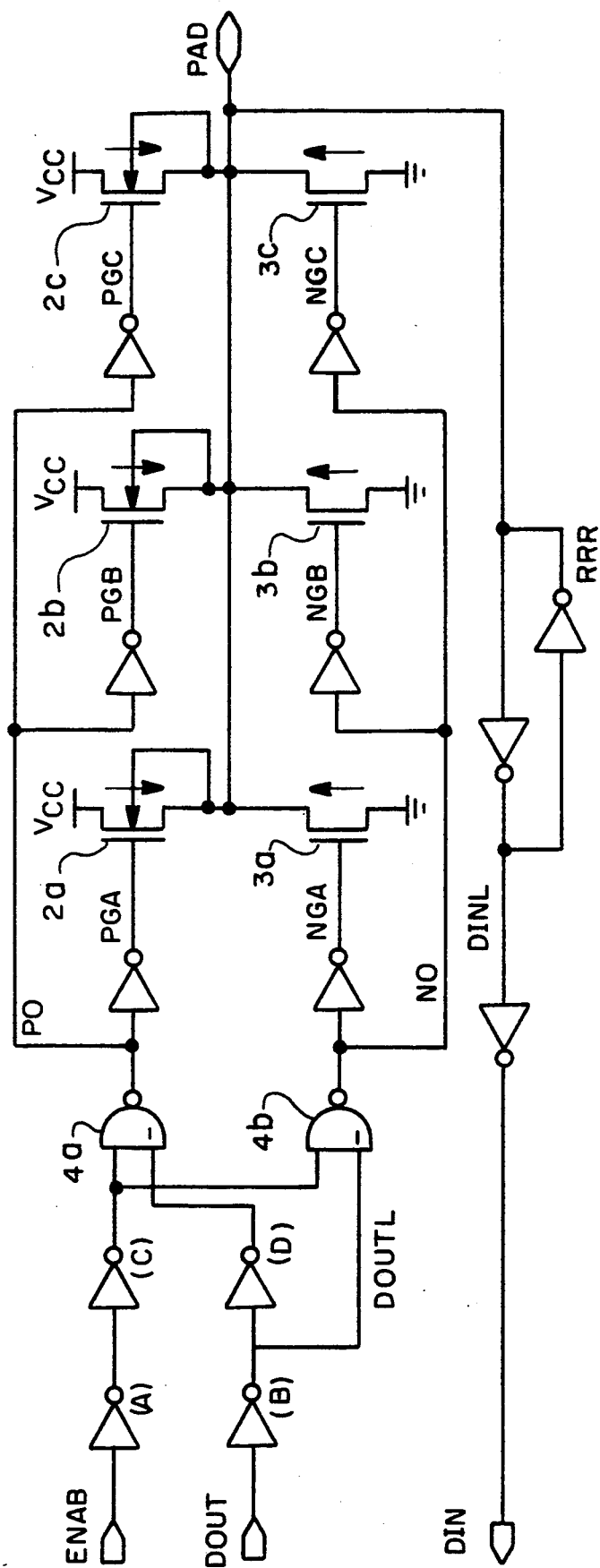
FIG. 1 is a schematic circuit diagram of a prior art output buffer circuit.
Figure 2:
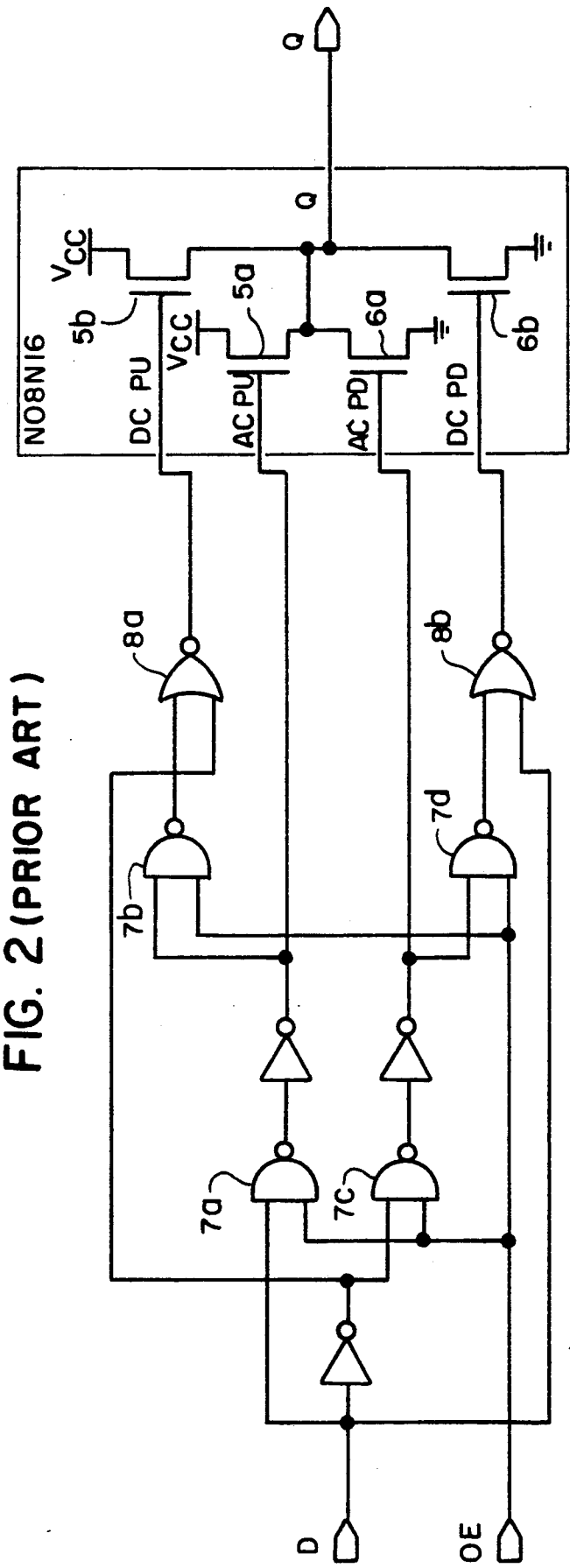
FIG. 2 is a schematic circuit diagram of another prior art output buffer circuit.
Figure 3:
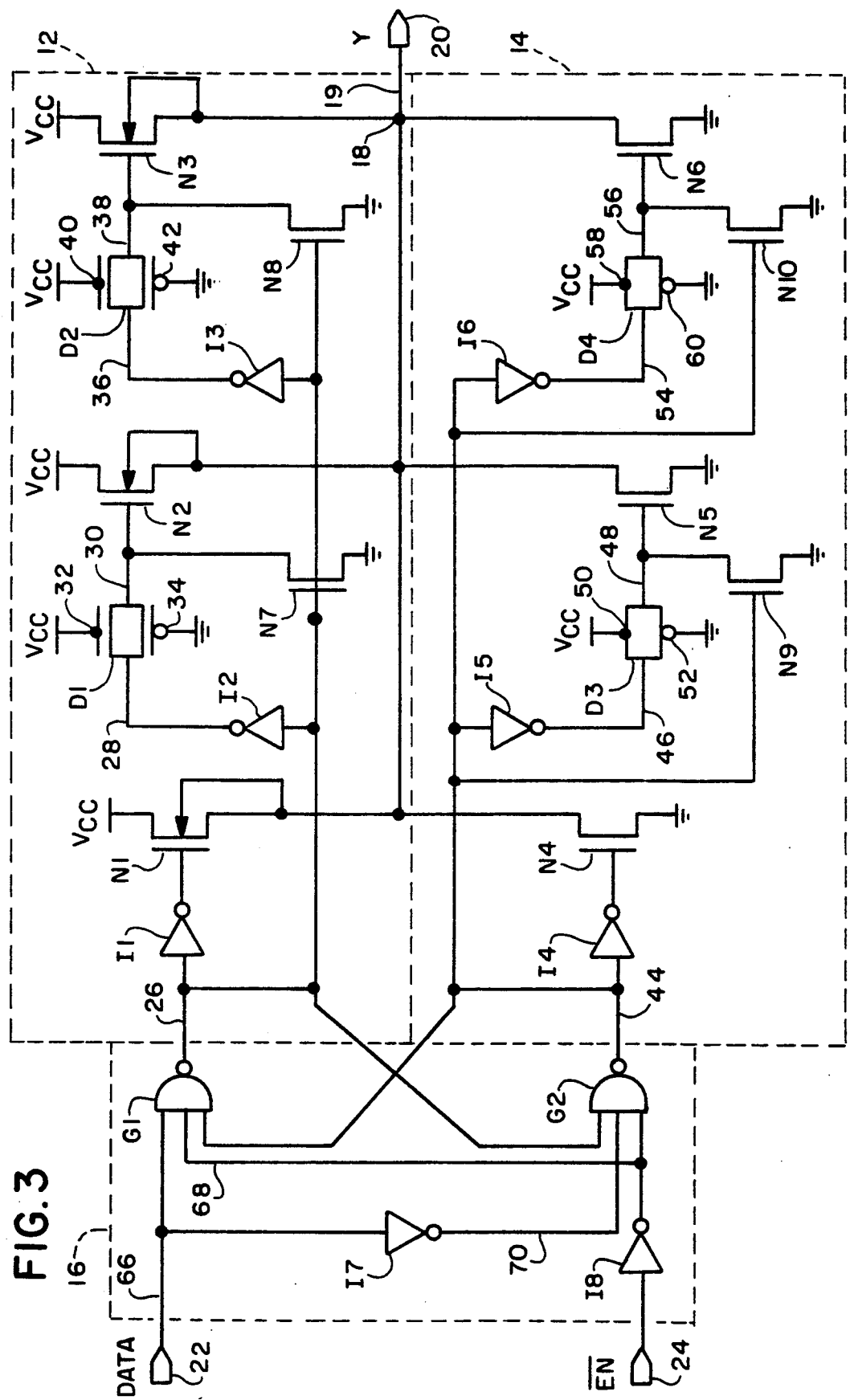
FIG. 3 is a schematic circuit diagram of a CMOS output buffer circuit, constructed in accordance with the principles of the present invention.

Referring now in detail to the drawings, there is shown in FIG. 3 a schematic circuit diagram of a CMOS output buffer circuit 10 which is constructed in accordance with the principles of the present invention. The CMOS output buffer circuit 10 is formed of a pull-up driver circuit 12, a pull-down driver circuit 14, and a control circuit 16. The pull-up driver circuit 12 is connected between a first power supply potential or voltage VCC, which is typically at $+5.\phi$ volts, and an internal output node 18 The pull-down driver circuit 14 is connected between the internal output node 18 and a second power supply potential, which is typically at zero volts. The internal output node 18 is further connected to an external output terminal pin 20 via a lead connection 19 having an associated package inductance.

The buffer circuit 10 provides an output signal at the output terminal 20 in response to a data input signal DATA received at a data input node 22 and an enable signal $\overline{EN}$ received at enable input node 24. The CMOS output buffer circuit 10 provides capability of driving quickly output capacitive loads (not shown) connected to the pin 20, but yet reduces significantly the ground bounce or inductive ringing at the output node 18 when the pull-up driver circuit 12 and the pull-down driver circuit 14 are switching states.

The pull-up driver circuit 12 includes N-channel MOS pull-up transistors N1, N2 and N3; inverters I1, I2 and I3; first and second delay means D1 and D2; and first and second N-channel MOS turn-off transistors N7 and N8. The pull-down driver circuit 14 includes N-channel MOS pull-down transistors N4, N5 and N6; inverters I4, I5 and I6; third and fourth delay means D3 and D4; and third and fourth N-channel MOS turn-off transistors N9 and N10. The control circuit 16 includes first and second NAND logic gates G1 and G2 and inverters I7 and I8.

Each of the pull-up transistors N1, N2 and N3 in the pull-up driver circuit 12 has one of its main electrodes (drain) connected to the power supply potential VCC and its other one of its main electrodes (source) connected to the internal output node 18. The inverter I1 has its input connected to receive a first control signal on line 26 from the output of the first NAND logic gate G1 and its output connected to the gate electrode of the pull-up transistor N1. The first delay means D1 is a conventional transmission gate, which is always turned on or closed so as to function as a first resistive element, and is formed of a P-channel MOS transistor and an N-channel MOS transistor. The transmission gate D1 has a signal-in connection on line 28, a signal-out connection on line 30, and first and second control nodes 32, 34. The signal-in connection of the transmission gate D1 is connected to the output of the inverter I2 whose input is connected to receive also the first control signal at the output of the first NAND logic gate G1. The signal-out connection of the transmission gate D1 is connected to the gate electrode of the pull-up transistor N2. The first control node 32 of the transmission gate D1 defined by the gate electrode of the N-channel transistor is connected to the supply potential VCC, and the second control node 34 of the transmission gate D1 defined by the gate electrode of the P-channel transistor is connected to the ground potential. It should be understood that the transmission gate D1 being always biased on provides a channel resistance which forms in conjunction with the parasitic gate capacitance of the pull-up transistor N2 a first RC delay circuit.

The second delay means D2 is a conventional transmission gate and is constructed similar to the transmission gate D1 so as to serve as a second resistive element. The transmission gate D2 has a signal-in connection on line 36, a signal-out connection on line 38, and first and second control nodes 40, 42. The signal-in connection of the transmission gate D2 is connected to the output of the inverter I3 whose input is connected to receive first control signal at the output of the first NAND logic gate G1. The signal-out connection of the transmission gate D2 is connected to the gate electrode of the pull-up transistor N3. The first control node 40 of the transmission gate D2 defined by the gate electrode of the N-channel transistor is connected to the power supply potential VCC, and the second control node 42 of the transmission gate D2 defined by the gate electrode of the P-channel transistor is connected to the ground potential. The channel resistance of the transmission gate D2 forms in conjunction with the parasitic gate capacitance of the pull-up transistor N3 a second RC delay circuit.

The first turn-off transistor N7 has its drain electrode connected to the gate electrode of the pull-up transistor N2, its source electrode connected to the ground potential, and its gate electrode connected to receive the first control signal at the output of the first NAND logic gate G1. The second turn-off transistor N8 has its drain electrode connected to the gate of the pull-up transistor N3, its source electrode connected to the ground potential, and its gate electrode connected to receive the first control signal at the output of the first NAND logic gate G1.

Each of the pull-down transistors N4, N5 and N6 in the pull-down driver circuit 14 has one of its main electrodes (drain) connected to the internal output node 18 and its other one of its main electrodes (source) connected to the ground potential. The inverter I4 has its input connected to receive a second control signal on line 44 from the output of the second NAND logic gate G2 and its output connected to the gate electrode of the pull-down transistor N4. The third delay means D3 is a conventional transmission gate, which is always turned on or closed so as to function as a third resistive element, and is formed of a P-channel MOS transistor and an N-channel MOS transistor. The transmission gate D3 has a signal-in connection on line 46, a signal-out connection on line 48, and first and second control nodes 50, 52. The signal-in connection of the transmission gate D3 is connected to the output of the inverter I5 whose input is connected to receive also the second control signal at the output of the second NAND logic gate G2. The signal-out connection of the transmission gate D3 is connected to the gate electrode of the pull-down transistor N5. The first control node 50 of the transmission gate D3 defined by the gate electrode of the N-channel transistor is connected to the supply potential VCC, and the second control node 52 of the transmission gate D3 defined by the gate electrode of the P-channel transistor is connected to the ground potential. It should be understood that the transmission gate D3 being always biased on provides a channel resistance which forms in conjunction with the parasitic gate capacitance of the pull-down transistor N5 a third RC delay circuit.

The fourth delay means D4 is a conventional transmission gate and is constructed similar to the transmission gate D3 so as to serve as a fourth resistive element. The transmission gate D4 has a signal-in connection on line 54, a signal-out connection on line 56, and first and second control nodes 58, 60. The signal-in connection of the transmission gate D4 is connected to the output of the inverter I6 whose input is connected to receive second control signal at the output of the second NAND logic gate G2. The signal-out connection of the transmission gate D4 is connected to the gate electrode of the pull-down transistor N6. The first control node 58 of the transmission gate D4 defined by the gate electrode of the N-channel transistor is connected to the power supply potential VCC, and the second control node 60 of the transmission gate D4 defined by the gate electrode of the P-channel transistor is connected to the ground potential. The channel resistance of the transmission gate D4 forms in conjunction with the parasitic gate capacitance of the pull-down transistor N6 a fourth RC delay circuit.

The third turn-off transistor N9 has its drain electrode connected to the gate electrode of the pulldown transistor N5, its source electrode connected to the ground potential, and its gate electrode connected to receive the second control signal at the output of the second NAND logic gate G2. The fourth turn-off transistor N10 has its drain electrode connected to the gate of the pull-down transistor N6, its source electrode connected to the ground potential, and its gate electrode connected to receive the second control signal at the output of the second NAND logic gate G2.

The NAND logic gates G1 and G2 of the control circuit 16 are connected so as to form an RS cross-coupled latch for generating the first and second control signals. The gate G1 has a first input connected to receive the data input signal DATA via line 66, a second input connected to receive the enable signal $\overline{EN}$ via line 68 and the inverter I8, and a third input connected to the output of the NAND logic gate G2 on the line 44. The output of the gate G1 provides the first control signal on the line 26. The gate G2 has a first input connected to the output of the inverter I7 on line 70 (which is the inverted or complement of the data input signal), a second input connected to receive the same enable signal EN via the output of the inverter I8, and a third input connected to the output of the NAND logic gate G1 on the line 26. The output of the gate G1 provides the second control signal on the line 44.

When the enable signal $\overline{EN}$ is at a high or logic "1" level, the outputs of both the NAND logic gates G1 and G2 on the respective lines 26 and 44 will be at a high or logic "1" level. Consequently, all of the transistors N1–N3 in the pull-up driver circuit 12 will be turned off, and all of the transistors N4–N6 in the pull-down driver circuit 14 will also be turned off. This produces a high impedance tri-state mode at the output terminal pin 20 in which the output buffer circuit 10 is not enabled.

The pull-down action of operation of the CMOS output buffer circuit 10 will now be explained. When the output terminal pin 20 is to be pulled to the low or logic "φ" level, the enable signal $\overline{EN}$ must be at a low logic level so as to enable the NAND logic gates G1 and G2, and the data input signal DATA must be at a high logic level. Thus, the output of the gate G2 will be at a high logic level and the output of the gate G1 will be at a low logic level. Due to the inverters I1–I3, it will be assumed that all of the pull-up transistors N1–N3 are rendered conductive and that the output terminal 20 is at a high logic level. Since the output of the gate G1 is at the low logic level, the turnoff transistors N7 and N8 will both be turned off. Further, it will be noted that all of the pull-down transistors N4–N6 in the pull-down driver circuit 14 will be turned off due to the inverters I4–I6. Finally, the turn-off transistors N9 and N10 will be rendered conductive so as to assist in maintaining the pull-down transistors N5 and N6 to be turned off.

When the data input signal DATA makes a high-to-low transition, this will cause the first control signal on the line 26 to go to a high logic level. This, in turn, will cause the output of the inverter I1 to go low so as to turn off the pull-up transistor N1. Further, the turn-off transistors N7 and N8 will be quickly turned on so as to turn off the pull-up transistors N2 and N3, respectively. It can be seen that the transistor N7 bypasses the inverter I2 and the resistive element D3 so as to facilitate the fast turn off of the transistor N2. Similarly, the turn-off transistor N8 bypasses the inverter I3 and the resistive element D2 so as to facilitate the fast turn-off of the pull-up transistor N3. It should be understood that after some time delay, the voltages on the signal-out connections 30 and 38 will change to the low level so as to reinforce the turning off of the respective pull-up transistors N2 and N3.

Shortly after the first control signal has gone to the high level, and not before then, the second control signal on the line 44 will go to a low level. Accordingly, all of the pull-up transistors N1–N3 will have already been turned off before the pull-down action is initiated by turning on first the pull-down transistor N4. This will serve to minimize the cross-current between the pull-up transistors and the pull-down transistors and thus reduces ground bounce. Since only the pull-down transistor N4 is initially turned on, the rate of change of the current flowing between the output terminal and the ground potential will be less than if all of the transistors N4–N6 had been turned on together. Typically, the transistor N4 will be made of a smaller size than the transistors N5 and N6. Also, the size of the transistor N5 will generally be smaller than the size of the transistor N6.

After a time delay caused by the third RC delay circuit (transmission gate D3 and gate capacitance of transistor N5) which delays the second control signal, the pull-down transistor N5 will be turned on and cause another rate of change of the output current. This third RC delay circuit serves to slow down the rate of rise of the gate-to-source voltage $V_{GS}$ at the gate of the pull-down transistor N5. As a result, the transistor N5 will have a slower turn-on time relative to the transistor N4. After another time delay caused by the fourth RC delay circuit (transmission gate D4 and gate capacitance of transistor N6) which delays the second control signal, pull-down transistor N6 will be turned on and cause a further rate of change of the output current. This fourth RC delay circuit serves to slow down the rate of rise of the gate-to-source voltage $V_{GS}$ at the gate of the transistor N6. Consequently, the transistor N6 will have an even slower turn-on time than the transistor N5. Since the current supplied to the output terminal 20 is provided in a piecemeal fashion by the successive turning-on of the pull-down transistors N4–N6, the rate of change of this output current is substantially reduced and thus reducing significantly the ground bounce. It will be noted that the amount of time delay caused by the fourth RC delay circuit can be made longer than the third RC delay circuit by increasing the resistance element D4 to be larger than the resistive element D3.

It should be apparent to those skilled in the art that the pull-up action of operation is quite similar to that described above with respect to the pull-down action. In particular, when the data input signal makes a low-to-high transition, all of the pull-down transistor N4–N6 will be turned off before the pull-up action is initiated by turning on first the pull-up transistor N1. Next, after a short time delay caused by the first RC delay circuit the pull-up transistor N2 will be turned on. Then, after a further time delay caused by the second RC delay circuit, the pull-up transistor N3 will be turned on.

In view of the foregoing discussion, it should be apparent that the first resistive element in conjunction with the gate capacitance of the pull-up transistor N2 forms a first RC delay circuit for delaying the turn-on time of the pull-up transistor N2 relative to the pull-up transistor N1 during the low-to-high transition at the output terminal. The second resistive element and the gate capacitance of the pull-up transistor N3 forms a second RC delay circuit for delaying the turn-on time of the pull-up transistor N3 relative to the pull-up transistor N2 during the low-to-high transition at the output terminal. Similarly, the third resistive element and the gate capacitance of the pull-down transistor N5 forms a third RC delay circuit for delaying the turn-on time of the pull-down transistor N5 relative to the pull-down transistor N4 during the high-to-low transition at the output terminal. The fourth resistive element and the gate capacitance of the pull-down transistor N6 forms a fourth RC delay circuit for delaying the turn-on time of the pull-down transistor N6 relative to the pull-down transistor N5 during the high-to-low transition at the output terminal. The first through fourth RC delay circuits serve to limit the rate of rise of the gate-to-source voltage $V_{GS}$ at the respective pull-up and pull-down transistors N2, N3, N5 and N6, respectively.

From the foregoing detailed description, it can thus be seen that the present invention provides a CMOS output buffer circuit which has a significant reduction in ground bounce. The CMOS output buffer circuit of the present invention includes a pull-up driver circuit, a pull-down driver circuit, and a control circuit for sequentially turning on the pull-up and pull-down transistors by limiting the rate of rise of the gate-to-source voltages at the corresponding transistors.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS output buffer circuit for providing an output signal at an output terminal with a significant reduction in ground bounce comprising:

pull-up driver circuit means (12) responsive to a first control signal for generating a transition from a low logic level to a high logic level at the output terminal;

said pull-up drive circuit means (12) being formed of first, second and third pull-up transistors (N1, N2, N3), each of said first through third transistors having one of its main electrodes connected to a power supply potential and its other one of its main electrodes coupled to the output terminal;

said pull-up driver circuit means including first, second and third inverters (I1, I2, I3) and first and second relative means (D1, D2), said first inverter (I1) having its output connected to the gate of said first pull-up transistor (N1), said second inverter (I2) having its output coupled to the gate of said second pull-up transistor (N2) via said first resistive elements (D1), said third inverter (I3) having its output coupled to the gate of said third pull-up transistor (N3) via said second resistive means (D2);

said pull-up driver means further including first and second turn-off transistors (N7, N8), said first turn-off transistor (N7) having its drain connected to the gate of said second pull-up transistor (N2) and its source connected to a ground potential, said second turn-off transistor (N8) having its drain connected to the gate of said third pull-up transistor (N3) and its source connected to the ground potential;

pull-down driver circuit means (14) responsive to a second control signal for generating a transition from the high logic level to the low logic level at the output terminal;

said pull-down driver circuit means (14) being formed of first, second, and third pull-down transistors (N5, N6, N7), each of said first through third pull-down transistors having one of its main electrodes connected to the output terminal and its other one of its main electrodes connected to the ground potential;

said pull-down driver circuit means (14) including fourth, fifth and sixth inverters (I4, I5, I6) and third and fourth resistive means (D3,D4), said fourth inverter (I4) having its output connected to the gate of said first pulldown transistor (N4), said fifth inverter (I5) having its output coupled to the gate of said second pull-down transistor (N5) via said third resistive means (D3), said sixth inverter (I6) having its output coupled to the gate of said third pull-down transistor (N6) via said fourth resistive means (D4);

said pull-down driver circuit means (14) further including third and fourth turn-off transistors (N9, N10), said third turn-off transistor (N9) having its drain connected to the gate of said second pull-down transistor (N5) and its source connected to the ground potential, said fourth turn-off transistor (N10) having its drain connected to the gate of said third pull-down transistor (N6) and its source connected to the ground potential;

control circuit means including first and second NAND logic gates (G1, G2) connected to form a cross-coupled latch and being responsive to a data input signal for generating said first control signal at the output of said first NAND logic gate (G1) and for generating said second control signal at the output of said second NAND logic gate (G2);

said first NAND gate (G1) having a first input connected to receive the data input signal and a second input connected to the output of said second NAND logic gate (G2), said second NAND logic gate (G2) having a first input connected to receive the data input signal via an inverter (I7) and a second input connected to the output of said first NAND logic gate (G1), the output of said first NAND gate being connected to the inputs of said first through third inverters (I1-I3) and to the gates of said first and second turn-off transistors (N7, N8), the output of said second NAND logic gate (G2) being connected to the inputs of said fourth through sixth inverters (I4-I6) and to the gates of said third and fourth turn-off transistors (N9, N10); and said first-fourth resistive means (D1-D4) consisting of first through fourth transmission gates each formed of a P-channel MOS transistor and an N-channel MOS transistor, said P-channel MOS transistor having its source connected to the drain of the said N-channel MOS transistor to define a signal-in connection, its drain connected to the source of said N-channel MOS transistor to define a signal-out connection, the gate of said P-channel MOS transistor defining a first control node and being connected to the ground potential, the gate of said N-channel MOS transistor defining a second control node and being connected to the power supply potential; and said signal-in connections of said first through fourth transmission gates being connected to the respective outputs of said second, third, fifth and sixth inverters (I2, I3, I5, I6), said signal-out connections of first through fourth transmission gates being connected to the respective gates of said second and third pull-up transistors (N2, N3) and said second and third pull-down transistors (N5, N6).

2. A CMOS output buffer circuit as claimed in claim 1, wherein said first resistive means and the gate capacitance of said pull-up transistor (N2) defines a first RC delay circuit for limiting the rate of rise of the gate-to-source voltage at the gate of said pull-up transistor (N2).

3. A CMOS output buffer circuit as claimed in claim 2, wherein said second resistive means and the gate capacitance of said pull-up transistor (N3) defines a second RC delay circuit for limiting the rate of rise of the gate-to-source voltage at the gate of said pull-up transistor (N3).

4. A CMOS output buffer circuit as claimed in claim 3, wherein said third resistive means and the gate capacitance of said pull-down transistor (N5) defines a third RC delay circuit for limiting the rate of rise of the gate-to-source voltage at the gate of said pull-down transistor (N5).

5. A CMOS output buffer circuit as claimed in claim 4, wherein said fourth resistive means and the gate capacitance of said pull-down transistor (N6) defines a fourth RC delay circuit for limiting the rate of rise of the gate-to-source voltage at the gate of said pull-down transistor (N6).

6. A CMOS output buffer circuit as claimed in claim 5, wherein said second pull-up transistor (N2) is delayed in its turn-on time relative to said first pullup transistor (N1) due to said first RC circuit and wherein said third pull-up transistor (N3) is delayed in its turn-on time relative to said second pull-up transistor (N2) due to said second RC circuit during the low-to-high transition at the output terminal.

7. A CMOS output buffer circuit as claimed in claim 6, wherein said second pull-down transistor (N5) is delayed in its turn-on time relative to said first pull-down transistor (N4) due to said third RC circuit and wherein said third pull-down transistor (N6) is delayed in its turn-on time relative to said second pull-down transistor (N5) due to said fourth RC circuit during the high-to-low transition at the output terminal.

8. A CMOS output buffer circuit as claimed in claim 1, wherein said first and second turn-off transistors (N7, N8) are quickly turned on so as to facilitate the fast turn-off of the respective pull-up transistors (N2,N3) for generating the high-to-low transition at the output terminal.

9. A CMOS output buffer circuit as claimed in claim 1, wherein said third and fourth turn-off transistors (N9, N10) are quickly turned on so as to facilitate the fast turn-off of the respective pull-down transistors (N5,N6) for generating the low-to-high transition at the output terminal.

10. A CMOS output buffer circuit as claimed in claim 1, wherein each of said first through third pull-up transistors (N1-N3) is an N-channel MOS transistor.

11. A CMOS output buffer circuit as claimed in claim 1, wherein each of said first through third pulldown transistors (N4-N6) is an N-channel MOS transistor.

12. A CMOS output buffer circuit as claimed in claim 1, wherein each of said first through fourth turnoff transistors (N7-N10) is an N-channel MOS transistor.

13. A CMOS output buffer circuit as claimed in claim 1, wherein said pull-up transistors (N1-N3) are all turned off before said first pull-down transistor (N4) is turned on, thereby minimizing cross-over current during the high-to-low transition.

14. A CMOS output buffer circuit as claimed in claim 1, wherein said pull-down transistors (N4-N6) are all turned off before said first pull-up transistor (N1) is turned on thereby minimizing cross-over current during the low-to-high transition.

* * * * *

UNITED STATES PATENT AND TRADEMARK OFFICE
CERTIFICATE OF CORRECTION

PATENT NO. : 5,124,579
DATED : June 23, 1992
INVENTOR(S) : Kianoosh Naghshineh

It is certified that error appears in the above-identified patent and that said Letters Patent is hereby corrected as shown below:

Column 2, line 36, change "71" to --7a--.

Column 6, line 23, change "pulldown" to --pull-down--.

Column 6, line 46, change "EN" to --$\overline{\overline{EN}}$--

Column 9, line 11, change "relative" to --resistive--.

Column 9, line 44, change "pulldown" to --pull-down--.

Signed and Sealed this

Tenth Day of August, 1993

Attest:

MICHAEL K. KIRK

*Attesting Officer*  *Acting Commissioner of Patents and Trademarks*